(12) United States Patent
Zheng

(10) Patent No.: US 6,188,624 B1
(45) Date of Patent: Feb. 13, 2001

(54) LOW LATENCY MEMORY SENSING CIRCUITS

(75) Inventor: Hua Zheng, Fremont, CA (US)

(73) Assignee: Winbond Electronics Corporation, Hsin Chu (TW)

(*) Notice: Under 35 U.S.C. 154(b), the term of this patent shall be extended for 0 days.

(21) Appl. No.: 09/352,543

(22) Filed: Jul. 12, 1999

(51) Int. Cl.[7] .................................................. G11C 7/02
(52) U.S. Cl. ............................................. 365/207; 365/205
(58) Field of Search .................................. 365/207, 205, 365/208, 190

(56) References Cited

U.S. PATENT DOCUMENTS 5,255,234 * 10/1993 Seok ........................................ 365/210
5,610,868 * 3/1997 Inaba et al. ............................ 365/205
5,715,210 * 2/1998 Yoo et al. ........................ 365/230.06

* cited by examiner

Primary Examiner—Richard Elms
Assistant Examiner—Hien Nguyen
(74) Attorney, Agent, or Firm—Dinh & Associates

(57) ABSTRACT

Memory sensing circuits having low latency or delay. Low latency can be achieved, in part, by utilizing multiple amplifiers in the sense amplifier circuit. Each amplifier detects and amplifies a differential voltage on a pair of lines used for sensing a logic state of a memory cell. The use of multiple amplifiers improves the response times of the lines, which can allow for an earlier detection of the voltages on the lines, a shorter memory access cycle, and an improved data transfer rate. Low latency can also be achieved by using a set of isolation switches and a latch in the sense amplifier circuit. The latch "captures" the voltages on the lines after the voltages have exceeded a set of thresholds. The latch provides the captured value to subsequent circuitry at the same time that the lines are "deactivated."

31 Claims, 8 Drawing Sheets

LOW LATENCY MEMORY SENSING CIRCUITS

BACKGROUND OF THE INVENTION

The present invention relates generally to integrated circuits, and more particularly to memory sensing circuits having low latency or delay.

Memory devices are integral to a computer system and to many electronic circuits. Continuous improvements in the operating speed and computing power of a central processing unit (CPU) enable operation of an ever-greater variety of applications, many of which require faster and larger memories. Larger memories can be obtained by shrinking the geometry of the memory cells and the data/control lines within the memory devices. Faster operating speed can be obtained by reducing the charge and discharge times of parasitic capacitance on internal data lines and by improving the data-clocking scheme within the memory devices.

Conventionally, a memory access to retrieve a data bit is performed by: (1) activating a row control line (e.g., a row select line or a word line) for the data bit; (2) waiting for the charge that is stored in a memory cell corresponding to the data bit to generate a voltage on a sense line; (3) sensing the charged voltage on the sense line to determine the value of the data bit; (4) activating a column select line; (5) providing the detected bit value to a data line; and (6) buffering and providing the data bit to an input/output (I/O) pin of the memory device. Conventionally, these steps are performed in sequential order for an accessed data bit. These steps define the access time of the memory device (i.e., to read a data bit), which in turn determines the data transfer rate.

For a dynamic random access memory (DRAM), a memory cell is typically implemented with a small capacitor coupled to a switch. When the memory cell is selected (by activating the switch) the capacitor is coupled to the sense line and shares charge with the parasitic capacitor on the sense line. Since the memory cell capacitance is typically much smaller than the parasitic capacitance, the voltage on the sense line only moves a small amount as a result of the charge sharing. One or more amplifiers are then used to amplify and buffer the voltage on the sense line to allow for accurate detection of the voltage, and thus the value stored in the memory cell. After sensing is completed, the amplifiers are also used to recharge the capacitor to it proper logic state (i.e., its previous state before the read cycle).

For a densely integrated memory device, a large number of memory cells are implemented on one device and many memory cells are coupled to each sense line. As a result, the memory cell capacitor is typically small and the parasitic capacitance on the sense line can be large (relatively). These characteristics result in a longer charge time for the sense line, which can correspond to a longer memory read cycle and a slower data access rate.

As can be seen, circuits that can improve the charge time of the sense line and the detection of the voltage on the sense line are highly desirable.

SUMMARY OF THE INVENTION

The invention provides memory sensing circuits having low latency or delay. In accordance with one aspect of the invention, low latency is achieved, in part, by utilizing multiple amplifiers in the sense amplifier circuit. Each amplifier detects and amplifies a differential voltage on a pair of lines used for sensing a logic state of a memory cell. The use of multiple amplifiers improves the response times of the lines, which can allow for an earlier detection of the voltages on the lines, a shorter memory access cycle, and an improved data transfer rate. In accordance with another aspect of the invention, a set of isolation switches and a latch are provided for the sense amplifier circuit. The latch "captures" the voltages on the lines after the voltages have exceeded a set of thresholds. The latch then provides the captured value to subsequent circuitry at the same time that the lines are "deactivated" (i.e., equalized or precharged to a midscale voltage).

An embodiment of the invention provides a sense amplifier circuit for sensing a logic state of a memory cell. The sense amplifier circuit includes an isolation circuit, a first amplifier, a second amplifier, and a third amplifier. The isolation circuit couples between a first pair of lines and a second pair of lines. The first pair of lines can be the sense amplifier lines and the second pair of lines can be the bit lines. The memory cell is operatively coupled to at least one of the lines in the second pair and shares charge, when selected, with the line(s) to which it couples. Each of the first, second, and third amplifiers couples between one of the pairs of lines and is configured to detect and amplify a voltage difference between the lines to which it couples. In a specific embodiment, the first amplifier is a N-channel amplifier, the second amplifier is a P-channel amplifier, and the third amplifier can be either a N-channel or a P-channel amplifier. The amplifiers can be enabled in a manner to provide improved response time for the lines.

The sense amplifier circuit can further include additional amplifiers (i.e., N-channel or P-channel, or both) that can couple to either the first or second pair of lines, or both, and at various locations along the lines. The additional amplifiers further amplify the voltage difference between the lines. The sense amplifier circuit can also include an equalization circuit coupled between the second pair of lines.

Another embodiment of the invention provides a sense amplifier circuit for sensing a logic state of a memory cell. The sense amplifier circuit includes an isolation circuit, a first amplifier, a second amplifier, a first set of switches, and a latch. The isolation circuit couples between a pair of sense amplifier lines and a pair of bit lines. The memory cell is coupled to at least one of the bit lines and shares charge, when selected, with the line(s) to which it couples. Each of the first and second amplifiers couples between a pair of lines and is configured to detect and amplify a differential voltage on the lines to which it couples. The first set of switches couples between the pair of sense amplifier lines and a pair of data lines. The latch couples between the data lines and is configured to latch a differential voltage on the data lines. The sense amplifier circuit can further include any combination of the features described above.

Yet another embodiment of the invention provides a memory device that includes a row decoder, a column decoder, a memory aray, and a sense amplifier. The row decoder is configured to receive address information and generate a first set of control signals. The column decoder is configured to receive address information and generate a second set of control signals. The memory array couples to the row and column decoders and is configured to provide a data value in response to the first and second sets of control signals. The sense amplifier couples to the memory array and is configured to receive and condition the data value and provide a data bit. The memory device can further include an output circuit and a timing circuit. The output circuit couples to the sense amplifier and is configured to receive the data bit and provide an output bit. The timing circuit couples to the sense amplifier and is configured to provide a set of control signals for the sense amplifier.

The sense amplifier includes an isolation circuit, a first amplifier, a second amplifier, and a third amplifier. The isolation circuit couples between a pair of sense amplifier lines and a pair of bit lines. The data value is provided to at least one of the bit lines. Each of the first, second, and third amplifiers couples between a pair of lines and is configured to detect and amplify a differential voltage on the lines to which it couples. Again, the sense amplifier circuit can further include any combination of the features described above.

The foregoing, together with other aspects of this invention, will become more apparent when referring to the following specification, claims, and accompanying drawings.

DESCRIPTION OF THE SPECIFIC EMBODIMENTS

Figure 1:
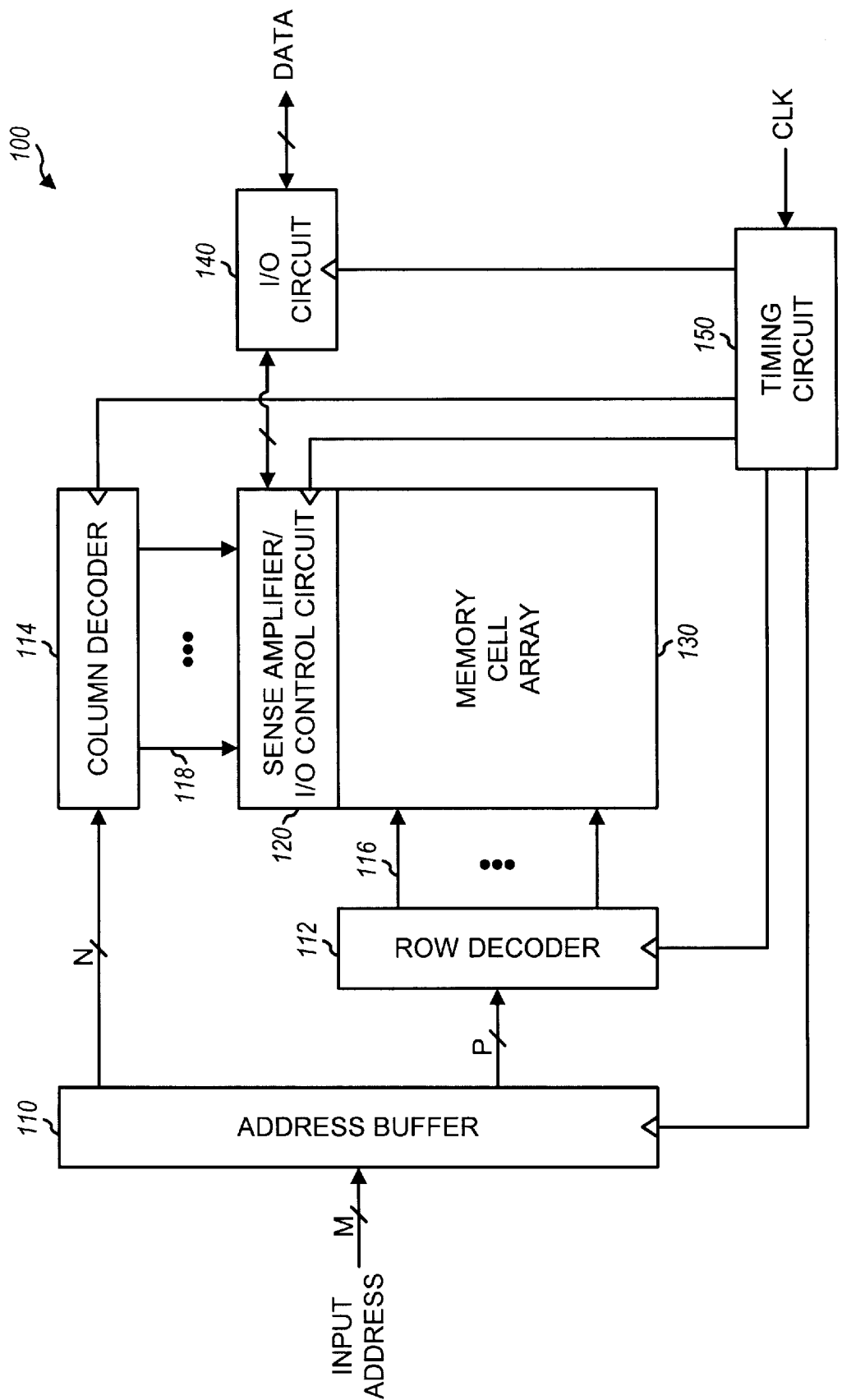
FIG. 1 shows a simplified diagram of an embodiment of a memory device.

FIG. 1 shows a simplified diagram of an embodiment of a memory device 100. As shown in FIG. 1, memory device 100 includes an address buffer 110 for receiving an input address and providing buffered address information to a row decoder 112 and a column decoder 114. Row decoder 112 activates one of a number of row control lines (or word lines) 116 for the selected memory cell(s), as determined by the address information received from buffer 110. In some memory array architectures, row decoder 112 may select a subset (i.e., two or more) of word lines to allow concurrent access to multiple memory cells.

Similarly, column decoder 114 activates one of a number of column select lines (CSLs) 118 for the selected memory cell(s), as determined by the address information received from buffer 110. CSLs 118 couple to a sense amplifier and input/output (I/O) control circuit 120. Circuit 120 further couples to a memory cell array 130 and an I/O circuit 140. Circuit 120 provides the signal conditioning and drive for the signals to and from memory cell array 130. Circuit 120 further provides the control and signal buffering for the signals to and from I/O circuit 140. I/O circuit 140 provides signal buffering and drive for data bits to be provided to the device I/O pads, signal buffering for data bits to be provided to the memory array, and other functions. A timing circuit 150 generates the clocks and control signals for the various circuits within memory device 100.

Memory cell array 130 includes memory cells for many data bits. The memory cells are typically arranged in a two-dimensional array. Word line 116 from row decoder 112 selects a particular row within memory cell array 130, and CSL 118 from column decoder 114 selects a particular column. In a specific embodiment, each memory cell array 130 includes 512 columns and 512 word lines (plus some redundant columns and word lines). Typically, one CSL is provided for one or more bit lines (BL). The selected word line and CSL are activated in accordance with the address provided to address buffer 110 by a source external or internal to the memory device.

For simplicity, FIG. 1 shows only one memory cell array 130. Generally, a memory device includes more than one memory cell array, which may be arranged into a number of memory blocks. Each memory block can include any number of memory cell arrays. As an example, a memory device can be a 64-Mbit DRAM device having four memory array blocks, with each memory array block including sixteen memory cell arrays, whereby each memory cell array includes 1 Mbits of memory. As another example, a memory device can be a 256-Mbit DRAM device having eight memory array blocks, with each memory array block including sixteen memory cell arrays, whereby each memory cell array includes 2 Mbits of memory.

Figure 2:
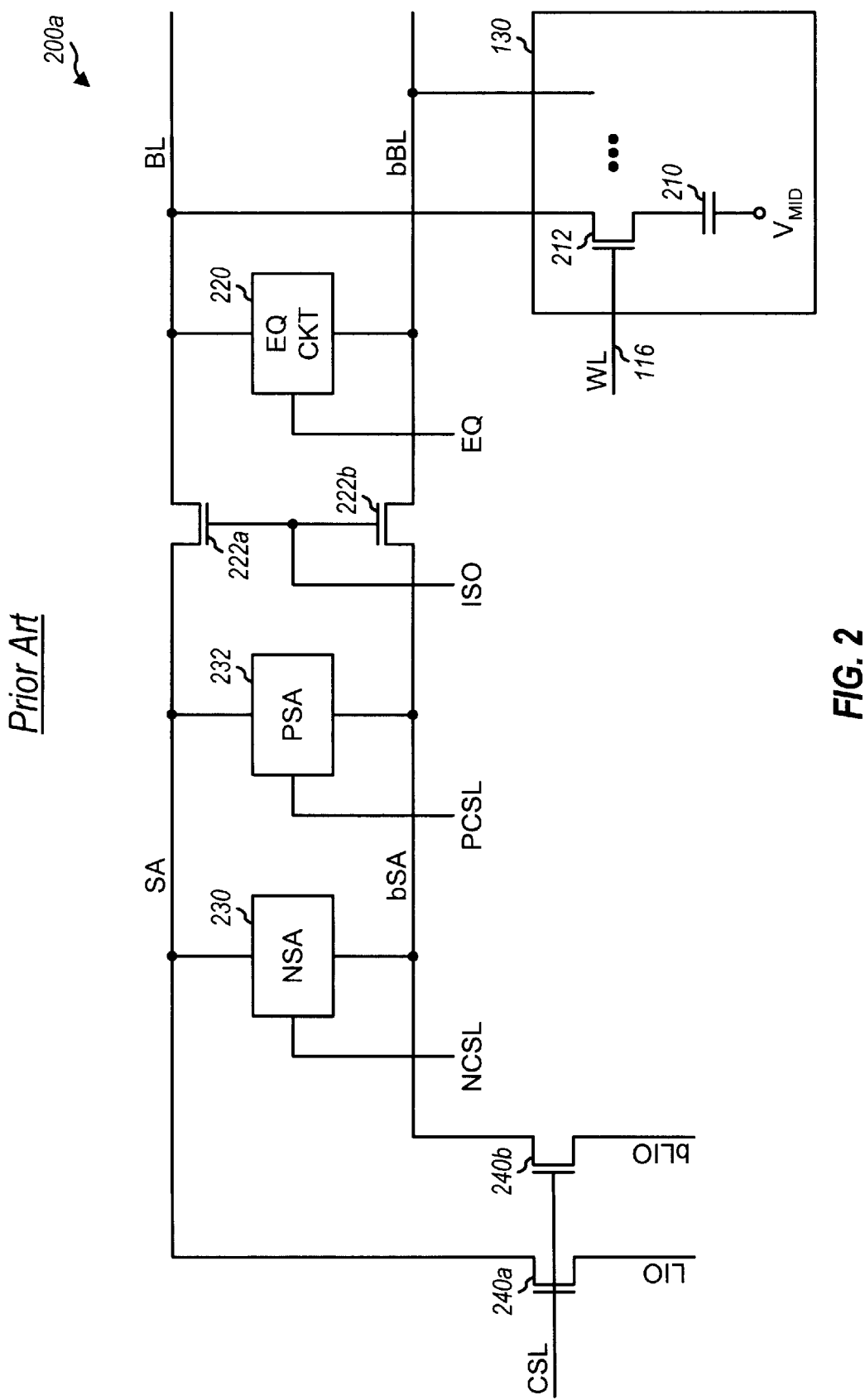
FIG. 2 shows a diagram of an embodiment of a conventional sense amplifier for sensing a particular bit line.

FIG. 2 shows a diagram of an embodiment of a conventional sense amplifier 200a for sensing a particular bit line. Referring back to FIG. 1, sense amplifier and I/O control circuit 120 includes a number of sense amplifiers and other supporting circuitry that cooperate to detect voltages stored in selected memory cells in array 130. Circuit 120 can include a number of sense amplifier 200a, one for each bit line.

As shown in FIG. 2, sense amplifier 200a couples to a pair of bit lines BL and bBL. Each bit line couples to a number of memory cells (e.g., 256 memory cells in a specific embodiment). Each memory cell includes a capacitor 210 that is selectively coupled to one of the bit lines (BL or bBL) via a switch 212. One end of the capacitor is coupled to a midscale voltage $V_{MID}$ that, in a specific embodiment, can be set at approximately half the supply voltage. As shown in FIG. 2, switch 212 is implemented with an N-channel transistor and is controlled by a word line 116. Only one capacitor and one switch are shown in FIG. 2 for simplicity.

Sense amplifier 200a includes an equalization circuit (EQ CKT) 220 that couples between the pair of bit lines. The equalization circuit brings the voltages on the bit lines together after a read cycle in preparation for the next memory access cycle. The equalization circuit is further described below.

An isolation circuit is coupled in series with the bit lines and provides (noise) isolation between the bit lines and the sense amplifier lines (SA and bSA) to which the remaining circuitry in sense amplifier 200a couples. As shown in FIG. 2, the isolation circuit is implemented with a pair of N-channel transistors 222a and 222b, one transistor coupled in series with each bit line. The gates of transistors 222 couple together and are controlled by a control signal ISO. When isolation transistors 222 are activated, the voltages on the bit lines BL and bBL are coupled to the sense amplifier lines SA and bSA, respectively.

Sense amplifier 200a further includes a pair of amplifiers, a N-channel amplifier (NSA) 230 and a P-channel amplifier (PSA) 232 that are controlled by the control signals NCSL and PCSL, respectively. NSA 230 senses the voltage difference on the sense amplifier lines and brings either line SA or bSA to a low voltage, depending on the sensed voltage difference. Similarly, PSA 232 senses the voltage difference on the sense amplifier lines and brings the complementary line (i.e., the line not brought low by NSA 230) to a high voltage, again depending on the sensed voltage difference.

A pair of switches couples the sense amplifier lines SA and bSA to the local data lines LIO and bLIO, respectively. The switches are implemented with N-channel transistors 240a and 240b. The differential voltage on the local data lines is provided to circuitry that detects and latches the voltage.

A read cycle is performed in the following manner. Initially, the equalization circuit is activated by bringing the control signal EQ high, which shorts out the bit lines BL and bBL and brings the voltages on these lines together. The word line corresponding to the desired memory cell is then activated and the memory cell capacitor charges or discharges the bit line (BL or bBL) to which it couples. Shortly thereafter, the isolation circuit is turned on by bringing the control signal ISO high. The isolation circuit couples the voltages on the bit lines BL and bBL to the sense amplifier lines SA and bSA, respectively. The NSA is then "fired" by bringing the control signal NCSL low. The NSA then detects the voltage difference and pulls either line SA or bSA low. A short time later, the PSA is fired by bringing the control signal PCSL high. The PSA detects the voltage difference and pulls the complementary line (either line bSA or SA not brought low by the NSA) high. After the voltages on the sense amplifier lines exceed a particular set of thresholds, column switches 240 are activated and the voltages are provided to the local data lines LIO and bLIO for detection (i.e., latching) by a subsequent circuit.

Figure 3A:
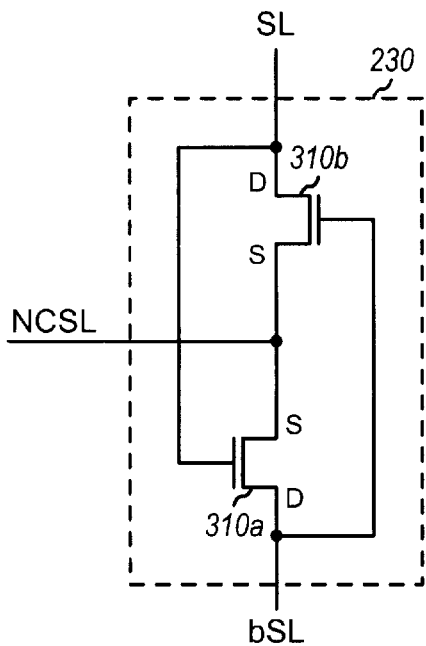
FIGS. 3A and 3B show schematic diagrams of an embodiment of a N-channel amplifier and P-channel amplifier, respectively.
Figure 3B:
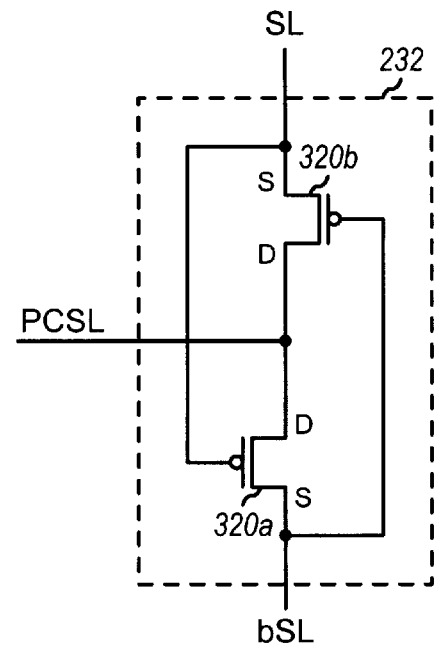

FIGS. 3A and 3B show schematic diagrams of an embodiment of NSA 230 and PSA 232, respectively. Within NSA 230, a pair of N-channel transistors 310a and 310b couples in series, and are cross-coupled. The gate of transistor 310a couples to the drain of transistor 310b and the gate of transistor 310b couples to the drain of transistor 310a. The drains of transistors 310a and 310b couple to the sense lines SL and bSL, respectively. SL and bSL can correspond to SA and bSA, respectively, in FIG. 2. The control signal NCSL couples to the sources of both transistors.

NSA 230 operates in the following manner. When the control signal NCSL is low, the sources of transistors 310a and 310b are below the voltages of the sense lines (which have been biased at a mid-scale voltage), and the transistors are activated. If the voltage on the sense line SL is greater than the voltage on the complementary sense line bSL, transistor 310a turns on harder, which then pulls the complementary sense line bSL lower. The lower voltage on the complementary sense line bSL turns transistor 310b toward the off state, which releases (or floats) the voltage on the sense line SL. A similar (but complementary) set of events occurs if the voltage on the complementary sense line bSL is greater than the voltage on the sense line SL. Thus, NSA 230 pulls either line SL or bSL to a low voltage depending on the voltage difference between the sense lines.

In FIG. 3B, PSA 232 comprises a pair of P-channel transistors 320a and 320b coupled in series, and cross-coupled. The gate of transistor 320a couples to the source of transistor 320b and the gate of transistor 320b couples to the source of transistor 320a. The sources of transistors 320a and 320b couple to the sense lines SL and bSL, respectively, which can be the lines SA and bSA in FIG. 2. The control signal PCSL couples to the drains of both transistors. PSA 232 operates in similar (but complementary) manner to NSA 230. PSA 232 pulls either line SL or bSL to a high voltage depending on the voltage difference between the sense lines.

Figure 3C:
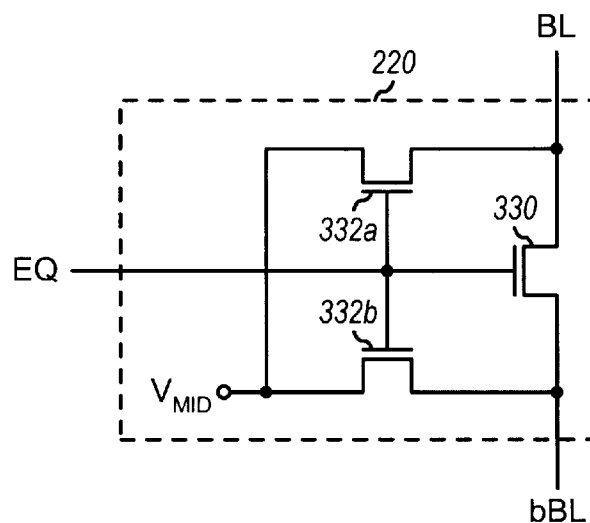
FIG. 3C shows a schematic diagram of an embodiment of an equalization circuit.

FIG. 3C shows a schematic diagram of an embodiment of equalization circuit 220. As shown in FIG. 3C, equalization circuit 220 includes a N-channel transistor 330 coupled between the pair of bit lines BL and bBL and enabled by a control signal EQ. When activated, transistor 330 effectively shorts out the bit lines. Equalization circuit 220 further includes a pair of N-channel transistors 332a and 332b that charge (or pull) the bit lines BL and bBL, respectively, to the midscale voltage $V_{MID}$ (a similar voltage as that applied to one end of capacitor 210) when enabled by the control signal EQ.

Figure 4:
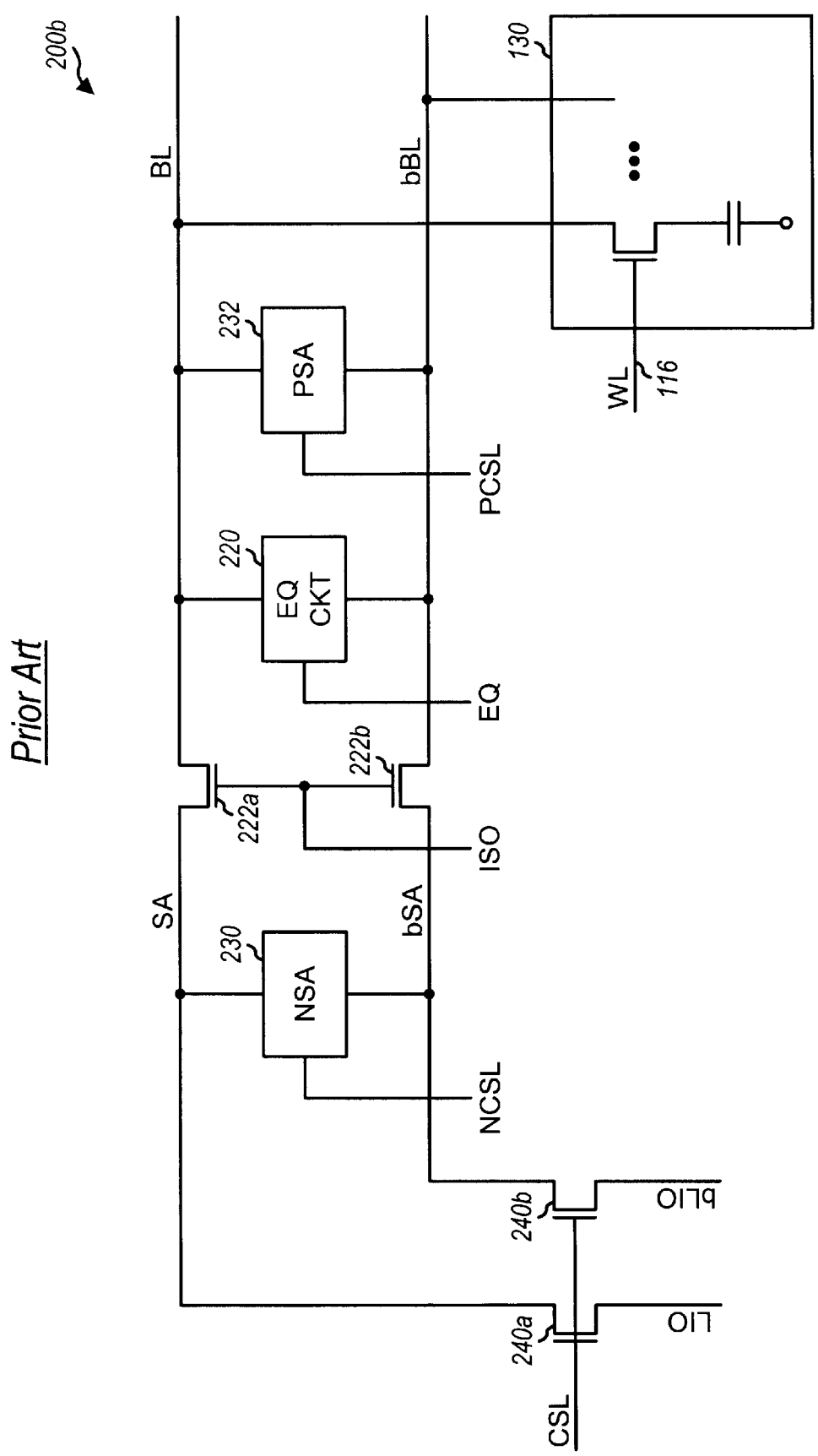
FIG. 4 shows a diagram of another embodiment of a conventional sense amplifier for sensing a particular bit line.

FIG. 4 shows a diagram of another embodiment of a conventional sense amplifier 200b for sensing a particular bit line. As shown in FIG. 4, sense amplifier 200b couples to a pair of bit lines BL and bBL. Sense amplifier 200b includes equalization circuit 220 coupled between the pair of bit lines, isolation circuit 222 coupled in series with the bit lines and configured to provide isolation between the bit lines and the sense amplifier lines, and a pair of amplifiers 230 and 232 coupled between the pair of lines. In FIG. 4, NSA 230 couples between the sense amplifier lines SA and bSA and PSA 232 couples between the bit lines BL and bBL. By placing PSA 232 between the bit lines (as oppose to between the sense amplifier lines), the bit line (BL or bBL) can be more quickly pull to a high voltage. However, because the isolation circuit is typically implemented using small sized transistors, the voltage on the sense amplifier line (SA or bSA) is pulled up by PSA 232 with a RC time constant.

Figure 5A:
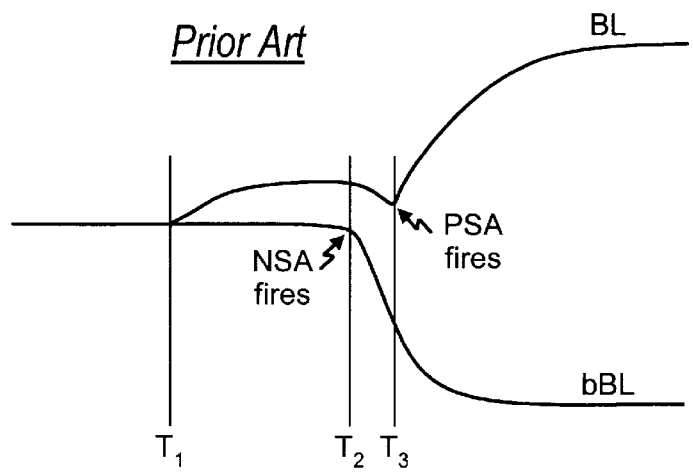
FIGS. 5A and 5B are diagrams showing the "charging" of the bit lines BL and bBL for the sense amplifiers shown in FIGS. 2 and 3, respectively.

FIG. 5A is a diagram showing the "charging" of the bit lines BL and bBL for sense amplifier 200a shown in FIG. 2. Initially, the voltages on the two lines are set approximately equal by turning on the equalization circuit. At time $T_1$, the memory cell switch is closed and the memory cell capacitor charges or discharges one of the bit lines. For the memory cell connected as shown in FIG. 2 and having a logic high stored therein, the charge on the memory cell capacitor is "shared" with the parasitic capacitor on the bit line BL, which increases the voltage on the bit line BL.

At time $T_2$, the NSA is "fired" (or activated) which detects the voltage difference and quickly pulls the complementary bit line bBL low (i.e., toward a logic low level). When the NSA pulls the complementary bit line bBL low, the bit line BL is also pulled low because of the capacitive coupling between the lines. This is reflected by the downward glitch on the bit line BL between times $T_2$ and $T_3$. At time $T_3$, the PSA is fired which detects the voltage difference and pulls the bit line BL high to a logic high level. The time interval between $T_3$ and $T_2$ can be, for example, approximately 0.5 nano seconds (nsec), although other values can also be used.

The NSA is typically activated first (before the PSA) because the N-channel transistors that make up the NSA have greater mobility than the P-channel transistors that make up the PSA. The NSA is generally more sensitive to a voltage difference and is turned on first when the voltage difference may be small. The difference in mobility is also reflected in the difference in the pull-up and pull-down times in FIG. 5A.

Figure 5B:
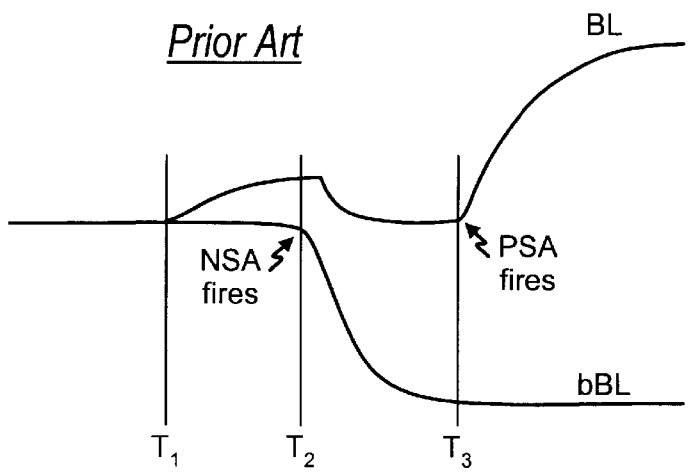

FIG. 5B is a diagram showing the charging of the bit lines BL and bBL for sense amplifier 200b shown in FIG. 4. The PSA is coupled to the bit lines BL and bBL and, once activated, is able to pull the bit line BL high more quickly. The downward droop on the bit line BL is due to the loading from the sense amplifier line SA which pulls the bit line BL low until the PSA is activated.

Figure 6B:
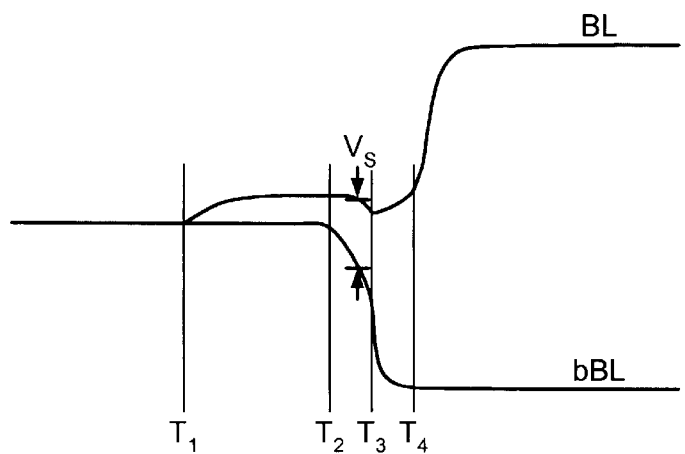
FIG. 6B is a diagram showing the response of the bit lines BL and bBL for the sense amplifier shown in FIG. 6A.
Figure 6A:
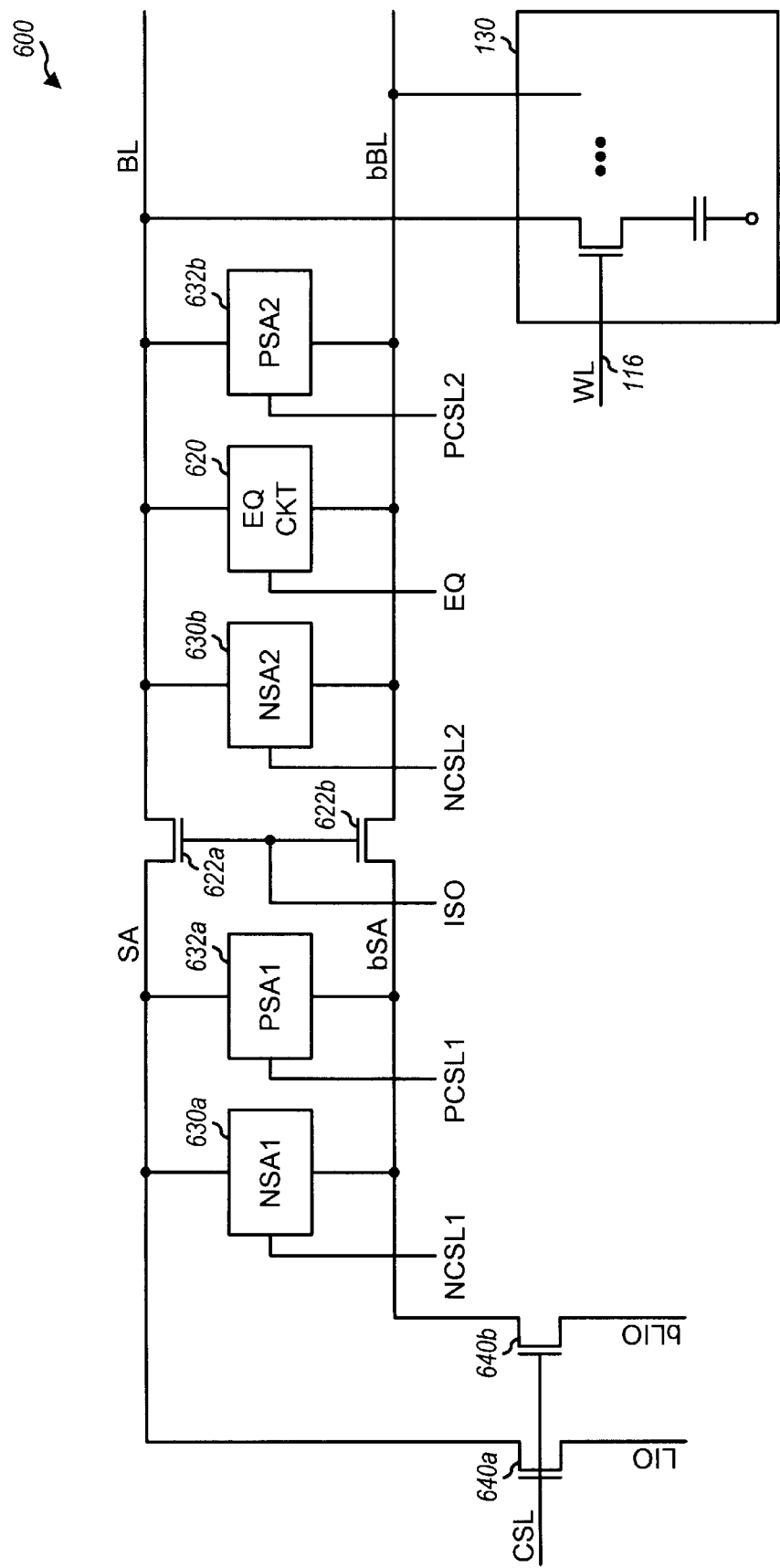
FIG. 6A shows a diagram of an embodiment of a sense amplifier for sensing a particular bit line and having improved response time.

FIG. 6A shows a diagram of an embodiment of a sense amplifier 600 for sensing a particular bit line and having improved response time. As shown in FIG. 6A, sense amplifier 600 couples to a pair of bit lines BL and bBL. Sense amplifier 600 includes an equalization circuit 620 coupled between the bit lines, an isolation circuit (comprising N-channel transistors 622a and 622b) coupled in series with the bit lines, a pair of amplifiers 630a and 632a coupled between the sense amplifier lines SA and bSA, and a set of switches 640a and 640b that couple the sense amplifier lines to the local data lines. These circuits are similar to the configurations shown in FIG. 2.

Sense amplifier 600 further includes a second pair of amplifiers 630b and 632b coupled between the bit lines BL and bBL. The additional amplifiers improve the response time of the bit lines. Generally, the second pair of amplifiers can be placed at any location on the left side of the bit lines BL and bBL. In the embodiment shown in FIG. 6A, the second pair of amplifiers is located between isolation circuit 622 and the bit lines BL and bBL. The second pair of amplifiers can also be placed in various orders. For layout efficiency, it may be advantageous to locate the N-channel transistors near each other. In FIG. 6A, equalization circuit 620 is placed near NSA 630b, both of which comprise N-channel transistors.

FIG. 6B is a diagram showing the response of the bit lines BL and bBL for sense amplifier 600 shown in FIG. 6A. At time $T_1$, the memory cell switch is closed and the memory cell capacitor charges the bit line BL. At time $T_2$, NSA 630a is fired, which quickly pulls the complementary bit line bBL low toward logic zero. At time $T_3$, after the voltage difference between the bit line pair exceeds a particular threshold value (e.g. $V_S$=80 mV), NSA 630b is fired which more quickly pulls down the complementary bit line bBL. At approximately the same time, PSA 632a is fired which pulls up the bit line BL toward logic high. PSA 632a can be fired earlier or later than at time $T_3$. At time $T_4$, PSA 632b is fired which more quickly pulls up the bit line BL. The time interval between $T_3$ and $T_2$ and between $T_4$ and $T_3$ can be, for example, 0.5 to 1.0 nsec, although other values can also be used.

In comparing the diagram shown in FIG. 6B with the diagrams shown in FIGS. 5A and 5B, it can be seen that the additional amplifiers improve the response time of the bit lines. As the result, the bit lines are ready for detection (i.e., by a latch) at an earlier time and the read cycle can be shorten correspondingly, thereby improving the memory access rate.

As shown in FIG. 6A, sense amplifier 600 includes an additional set of NSA and PSA coupled between the sense amplifier lines and located between the isolation circuit and the equalization circuit. Many modifications to sense amplifier 600 can be made and are within the scope of the invention. For example, the sense amplifier can be designed with one additional NSA, or one additional PSA, or more than one additional NSA or PSA, or any number of additional NSAs and PSAs. Furthermore, the additional amplifier(s) can be located at different locations than that shown in FIG. 6A. For example, one or more amplifiers can be located to the right of equalization circuit 620 or to the left of isolation circuit 622. In a specific embodiment, the sense amplifier includes one additional PSA located between isolation circuit 622 and equalization circuit 620.

Figure 7:
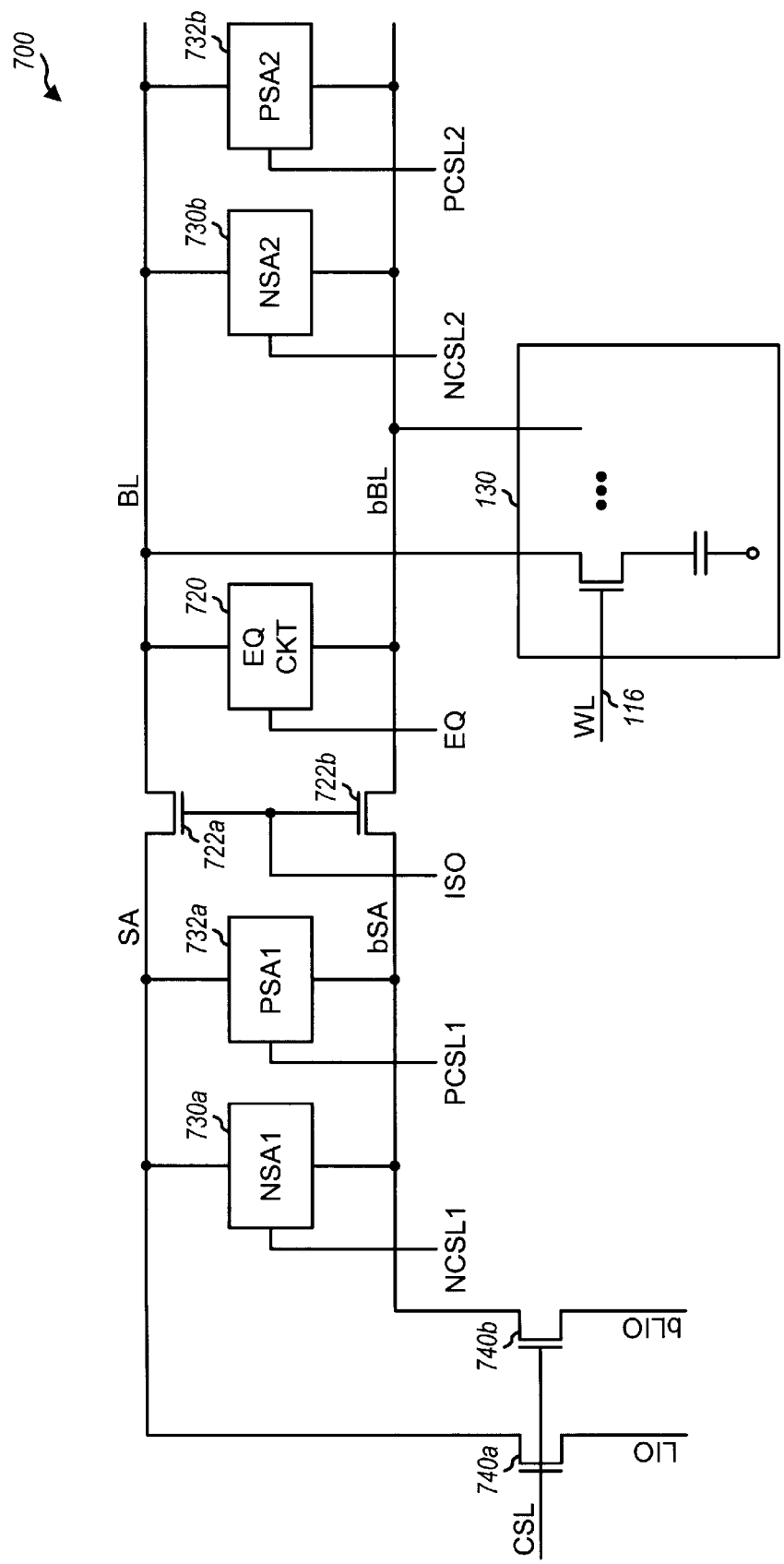
FIG. 7 shows a diagram of an embodiment of another sense amplifier for sensing a particular bit line and also having improved response time.

FIG. 7 shows a diagram of an embodiment of another sense amplifier 700 for sensing a particular bit line and also having improved response time. As shown in FIG. 7, sense amplifier 700 couples to a pair of bit lines BL and bBL. Sense amplifier 700 includes an equalization circuit 720 coupled between the pair of bit lines, an isolation circuit (comprising N-channel transistors 722a and 722b) coupled in series with the bit lines and configured to provide isolation between the bit lines and the sense amplifier lines, a pair of amplifiers 730a and 732a coupled between the sense amplifier lines SA and bSA, and a set of switches 740a and 740b that couple the sense amplifier lines and the local data lines. These circuits are similar to the configurations shown in FIGS. 2 and 6.

Sense amplifier 700 further includes a second pair of amplifiers 730b and 732b coupled between the bit lines BL and bBL and located to the right of the memory cells. Generally, a memory "core" includes a number of memory cells and the corresponding pair of word lines. Each word line typically traverses the length of the memory core and is associated with a particular resistance and capacitance. By placing the second pair of amplifiers toward the "far end" of the word lines, opposite from the end having the first pair of amplifiers, the bit lines can be charged from both ends, which effectively cuts the parasitic capacitance in half. Pulling the bit lines toward the final value from both ends results in improved response time.

FIG. 7 shows a set of amplifiers located at both ends of the bit lines. Additional amplifiers can also be dispersed along the bit lines for further improvement. Also, the amplifiers do not need to be placed in pairs (i.e., a NSA needs not be placed next to a PSA).

Generally, one or more additional amplifiers (i.e., either of the NSA or PSA type, or both) can be included in the sense amplifier. Moreover, the NSA(s) and PSA(s) within the sense amplifier can be activated using various timing schemes to achieve improved response times of the lines from which a data value is detected.

Figure 8:
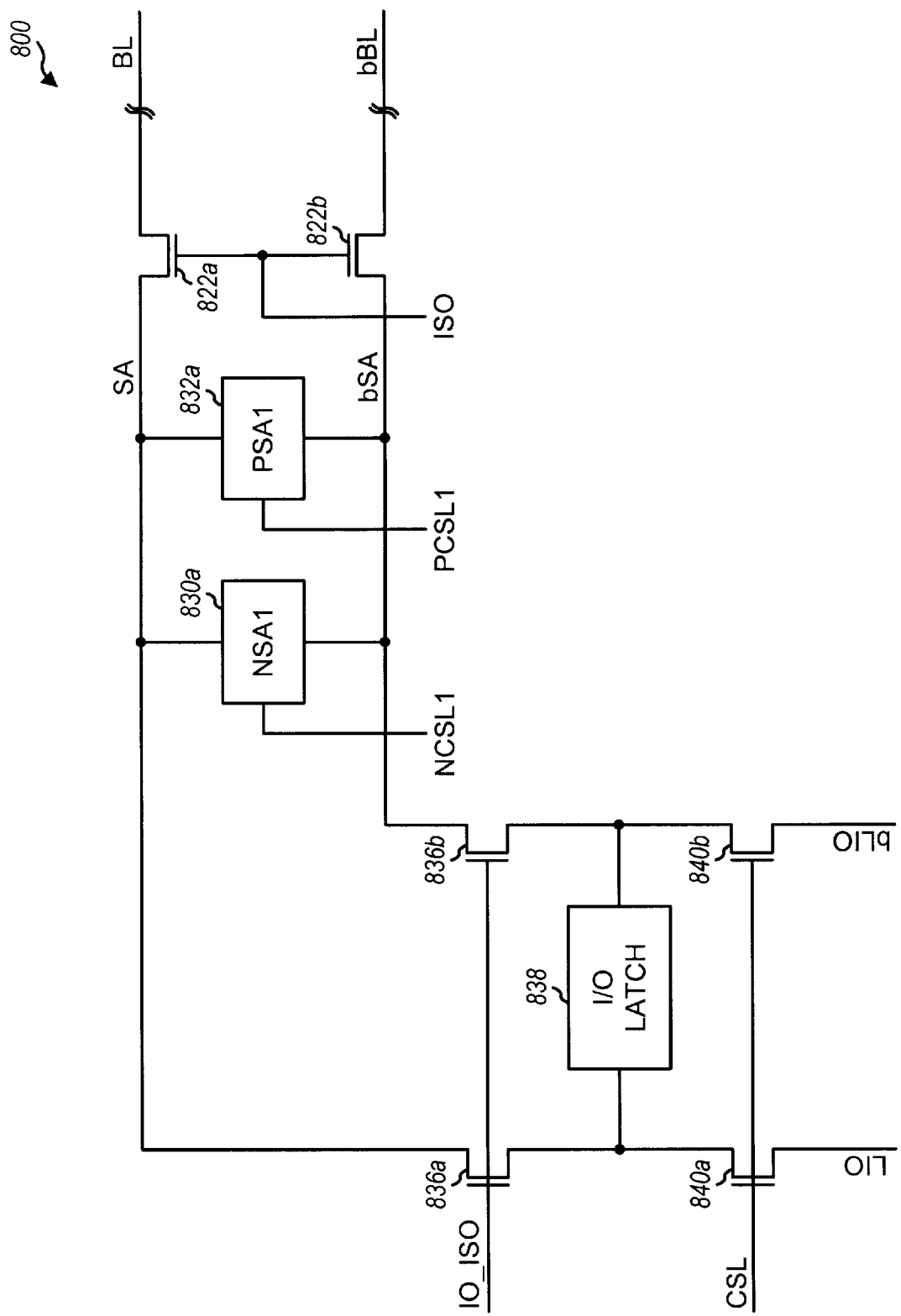
FIG. 8 shows a diagram of an embodiment of another sense amplifier for sensing a particular bit line and having improved data detection capability.

FIG. 8 shows a diagram of an embodiment of another sense amplifier 800 for sensing a particular bit line and having improved data detection capability. As shown in FIG. 8, sense amplifier 800 couples to a pair of bit lines BL and bBL. Sense amplifier 800 includes an equalization circuit (not shown), an isolation circuit (comprising N-channel transistors 822a and 822b) that couples in series with the bit lines, a pair of amplifiers 830a and 832a coupled between the sense amplifier lines SA and bSA, and a set of switches 840a and 840b that couple the sense amplifier lines and the local data lines. These circuits are similar to the configurations shown in FIGS. 2, 6, and 7. Sense amplifier 800 further includes a set of isolation switches 836a and 836b coupled between the sense amplifier lines SA and bSA and switches 840a and 840b. Sense amplifier 800 also includes an I/O latch 838 coupled between the sense lines and located between switches 836 and switches 840.

Sense amplifier 800 operates in similar manner as the sense amplifiers in FIG. 2, 6, or 7. During the initial part of the read cycle, isolation switches 836 are turned off and the NSA and PSA operate on the sense amplifier lines in the manner described above. When the voltages on the sense amplifier lines exceed a set of thresholds, isolation switches 836 are turned on and the differential voltage on the sense amplifier lines is coupled to I/O latch 838. Latch 838 latches the differential voltage. A short time later, isolation switches 836 are turned off and switches 840 are turned on. The latched voltage is then provided to the local data lines.

Isolation switches 836 and I/O latch 838 provide a level of "pipelining" in the read cycle such that the latched voltage can be provided to the local data lines while the sense amplifier lines are being prepared for the next memory access cycle. This pipelining reduces the latency, or delay, for a memory access. The intermediate data latching is also highly advantageous for a row copy operation in which multiple data bits (i.e., from multiple I/O latches) from a row can be saved while the row line can be deactivated (i.e., to bring the voltages on the sense lines closer together). This design is well suited for low latency, short row cycle applications.

The sensing circuits of the invention provide advantages over conventional sensing circuits. In particular, the sensing circuits of the invention provide improved response times for the sense lines (e.g., the bit lines BL and bBL), which can translate to improved read cycle time and higher data access rate. In conventional designs that use a single set of NSA and PSA, the charge times can be long and the clock period is extended to ensure proper data/clock timing relationship for all specified operating conditions. These conventional designs can result in a longer read cycle and a correspondingly slower operating speed for the device.

The additional amplifier(s) in the sensing circuits of the invention are relatively simple to implement and do not require much additional die area. As shown in FIGS. 3A and 3B, each NSA or PSA amplifier can be implemented with two transistors. The control signal for each additional amplifier can be generated by delaying an existing control signal for an existing amplifier.

The architectures described herein can be implemented within a stand-alone integrated circuit (IC) such as, for example, a dynamic random access memory (DRAM) IC, a synchronous graphics RAM (SGRAM), and other memory devices. The memory arrays can also be implemented within other ICs, such as a processor, a controller, a digital signal processor, an application specific integrated circuit (ASIC), and others. The memory architectures described herein can be implemented on a memory array that is embedded within an integrated circuit such as, for example, central processing unit (CPU).

The foregoing description of the specific embodiments is provided to enable any person skilled in the art to make or use the invention. Various modifications to these embodiments will be readily apparent to those skilled in the art, and the generic principles defined herein may be applied to other embodiments without the use of the inventive faculty. For example, the any number of additional NSAs and PSAs can be used in conjunction with the I/O latch. Thus, the specific implementation details described herein are intended to be illustrative, and not limitations, of the present invention. Accordingly, the invention is not intended to be limited to the embodiments shown herein but is to be accorded the widest scope consistent with the principles and novel features disclosed herein, and as defined by the following claims.

What is claimed is:

1. A sense amplifier circuit for sensing a logic state of a memory cell comprising:
    an isolation circuit coupled between a first pair of lines and a second pair of lines, wherein the memory cell is operatively coupled to at least one of the lines in the second pair and shares charge, when selected, with the at least one coupled line;
    a first amplifier coupled between the first pair of lines, the first amplifier configured to detect and amplify a voltage difference between the first pair of lines;
    a second amplifier coupled between the first pair of lines, the second amplifier configured to detect and amplify the voltage difference between the first pair of lines; and
    a third amplifier coupled between the second pair of lines, the third amplifier configured to detect and amplify a voltage difference between the second pair of lines, and
    wherein the first, second, and third amplifiers are configured to provide amplification of a voltage generated by the memory cell and are enabled in a particular order to provide improved sensing time for the memory cell.

2. The circuit of claim 1 wherein the first amplifier comprises a N-channel amplifier and the second amplifier comprises a P-channel amplifier.

3. The circuit of claim 2 wherein the N-channel amplifier, when enabled, pulls one of the lines in the first pair, based on the detected voltage difference, to a low value, and wherein the P-channel amplifier, when enabled, pulls a complementary line in the first pair, based on the detected voltage difference, to a high value.

4. The circuit of claim 1 further comprising:
    an equalization circuit coupled between the second pair of lines.

5. The circuit of claim 1 wherein the third amplifier is located between the isolation circuit and the second pair of lines.

6. The circuit of claim 4 wherein the third amplifier is located between the isolation circuit and the equalization circuit.

7. The circuit of claim 1 wherein the third amplifier is coupled toward a far end of the second pair of lines, away from the first and second amplifiers.

8. The circuit of claim 1 further comprising:
    a fourth amplifier coupled between the second pair of lines, the fourth amplifier configured to detect and amplify the voltage difference between the second pair of lines.

9. The circuit of claim 8 wherein the third amplifier comprises a N-channel amplifier and the fourth amplifier comprises a P-channel amplifier.

10. The circuit of claim 1 wherein the first, second, and third amplifiers are each implemented with a pair of cross-coupled transistors.

11. The circuit of claim 1 further comprising:
    a first set of switches coupled between the first pair of lines and a pair of data lines.

12. The circuit of claim 11 further comprising:
    a latch coupled between the data lines, the latch configured to latch a voltage difference between the data lines.

13. The circuit of claim 11 wherein the first set of switches is closed after voltages on the first pair of lines exceed a particular set of thresholds.

14. The circuit of claim 1 wherein the first amplifier is enabled at a first time instance and the second amplifier is enabled at a second time instance, the first time instance being earlier in time than the second time instance.

15. The circuit of claim 1 wherein the second amplifier is enabled after the voltage difference between the first pair of lines exceeds a particular threshold value.

16. The circuit of claim 1, and implemented within a dynamic random access memory (DRAM).

17. The circuit of claim 1, and implemented within an integrated circuit that includes an embedded memory.

18. A sense amplifier circuit for sensing a logic state of a memory cell comprising:
  an isolation circuit coupled between a pair of sense amplifier lines and a pair of bit lines, wherein the memory cell is coupled to at least one of the bit lines and shares charge, when selected, with the at least one coupled line;
  a first amplifier coupled between the sense amplifier lines, the first amplifier configured to detect and amplify a differential voltage on the sense amplifier lines;
  a second amplifier coupled between the sense amplifier lines or the bit lines, the second amplifier configured to detect and amplify the differential voltage on the lines to which it couples;
  a first set of switches coupled between the pair of sense amplifier lines and a pair of intermediate signal lines;
  a latch coupled between the intermediate signal lines, the latch configured to latch a differential voltage on the intermediate signal lines; and
  a second set of switches coupled between the pair of intermediate signal lines and a pair of data lines.

19. The sense amplifier circuit of claim 18, wherein the first amplifier comprises a N-channel amplifier and the second amplifier comprises a P-channel amplifier.

20. The sense amplifier circuit of claim 18, wherein the first and second amplifiers are each implemented with a pair of cross-coupled transistors.

21. The sense amplifier circuit of claim 18, wherein the first amplifier is enabled at a first time instance and the second amplifier is enabled at a second time instance, the first time instance being earlier in time than the second time instance.

22. A sense amplifier circuit for sensing a logic state of a memory cell comprising:
  an isolation circuit coupled between a pair of sense amplifier lines and a pair of bit lines, wherein the memory cell is coupled to at least one of the bit lines and shares charge, when selected, with the at least one coupled bit line;
  a N-channel amplifier coupled between the sense amplifier lines, the N-channel amplifier configured to detect and amplify a differential voltage on the sense amplifier lines;
  a P-channel amplifier coupled between the sense amplifier lines, the P-channel amplifier configured to detect and amplify the differential voltage on the sense amplifier lines; and
  an additional amplifier coupled between the bit lines, the additional amplifier configured to detect and amplify a differential voltage on the bit lines, and
  wherein the N-channel, P-channel, and additional amplifiers are configured to provide amplification of a voltage generated by the memory cell and are enabled in a particular order to provide improved sensing time for the memory cell.

23. The sense amplifier circuit of claim 22, further comprising:
  an equalization circuit coupled between the bit lines.

24. The sense amplifier circuit of claim 23, wherein the additional amplifier is located between the isolation circuit and the equalization circuit.

25. The sense amplifier circuit of claim 22, wherein the N-channel amplifier is enabled at a first time instance and the P-channel amplifier is enabled at a second time instance, the first time instance being earlier in time than the second time instance, and wherein the additional amplifier is enabled at a third time instance that is later than the earlier of the first and second time instances.

26. A memory device comprising:
  a row decoder configured to receive address information and generate a first set of control signals;
  a column decoder configured to receive address information and generate a second set of control signals;
  a memory array coupled to the row and column decoders, the memory array configured to provide a data value in response to the first and second sets of control signals; and
  a sense amplifier coupled to the memory array, the sense amplifier configured to receive and sense the data value and provide a data bit, the sense amplifier including
    an isolation circuit coupled between a pair of sense amplifier lines and a pair of bit lines, wherein the data value is provided to at least one of the bit lines,
    a first amplifier coupled between the sense amplifier lines, the first amplifier configured to detect and amplify a differential voltage on the sense amplifier lines,
    a second amplifier coupled between the sense amplifier lines, the second amplifier configured to detect and amplify the differential voltage on the sense amplifier lines, and
    a third amplifier coupled between the bit lines, the third amplifier configured to detect and amplify a differential voltage on the bit lines, and
    wherein the first, second, and third amplifiers are configured to provide amplification of the differential voltage on the bit lines corresponding to the data value, and wherein the amplifiers are enabled in a particular order to provide improved sensing time for the data value.

27. The memory device of claim 26 further comprising:
  an output circuit coupled to the sense amplifier, the output circuit configured to receive the data bit and provide an output bit.

28. The memory device of claim 26 further comprising:
  a timing circuit coupled to the sense amplifier, the timing circuit configured to provide a set of control signals for the sense amplifier.

29. The memory device of claim 26, wherein the sense amplifier further includes:
  an equalization circuit coupled between the bit lines.

30. The memory device of claim 26, wherein the first amplifier comprises a N-channel amplifier, the second amplifier comprises a P-channel amplifier, and the third amplifier comprises a N-channel or P-channel amplifier.

31. The memory device of claim 26, wherein the sense amplifier further includes:
  a first set of switches coupled between the sense amplifier lines and a pair of data lines.

* * * * *